(12) United States Patent
Murata

(10) Patent No.: US 12,245,509 B2
(45) Date of Patent: Mar. 4, 2025

(54) METHOD FOR MANUFACTURING VIBRATION DEVICE

(71) Applicant: Seiko Epson Corporation, Tokyo (JP)

(72) Inventor: Akihiro Murata, Hokuto (JP)

(73) Assignee: SEIKO EPSON CORPORATION (JP)

( * ) Notice: Subject to any disclaimer, the term of this patent is extended or adjusted under 35 U.S.C. 154(b) by 386 days.

(21) Appl. No.: 17/727,910

(22) Filed: Apr. 25, 2022

(65) Prior Publication Data

US 2022/0344577 A1 Oct. 27, 2022

(30) Foreign Application Priority Data

Apr. 26, 2021 (JP) ................... 2021-074356

(51) Int. Cl.
*H10N 30/088* (2023.01)
*H10N 30/05* (2023.01)

(52) U.S. Cl.
CPC ........... *H10N 30/088* (2023.02); *H10N 30/05* (2023.02)

(58) Field of Classification Search
CPC ........... H03H 2003/022; H03H 3/0072; H10N 30/02; H10N 30/03; H10N 30/071
See application file for complete search history.

(56) References Cited

U.S. PATENT DOCUMENTS

| 9,991,868 | B1 * | 6/2018 | Nguyen | G01C 19/5691 |
| 11,174,156 | B2 * | 11/2021 | Chang | B81C 1/00269 |
| 11,381,219 | B2 * | 7/2022 | Takeuchi | H03H 9/19 |
| 2004/0174092 | A1 * | 9/2004 | Iwata | H03H 3/04 |
| | | | | 310/324 |
| 2007/0046151 | A1 | 3/2007 | Aratake | |
| 2011/0050047 | A1 * | 3/2011 | Numata | H03H 9/21 |
| | | | | 29/25.35 |
| 2011/0062827 | A1 * | 3/2011 | Ichikawa | H03H 9/0595 |
| | | | | 29/25.35 |
| 2011/0199162 | A1 | 8/2011 | Funabiki | |
| 2012/0247217 | A1 * | 10/2012 | Suzuki | G01L 5/226 |
| | | | | 29/25.35 |

(Continued)

FOREIGN PATENT DOCUMENTS

| JP | 2003-264447 A | 9/2003 |
| JP | 2007013628 A * | 1/2007 |

(Continued)

*Primary Examiner* — Jeffrey T Carley
(74) *Attorney, Agent, or Firm* — Harness, Dickey & Pierce, P.L.C.

(57) ABSTRACT

A method for manufacturing a vibration device includes preparing a base wafer including a plurality of fragmentation regions, placing vibration elements at a first surface of the base wafer, producing a device wafer in which a housing that accommodates each of the vibration elements is formed in each of the fragmentation regions by bonding a lid wafer to the base wafer, forming a first groove, which starts from the lid wafer and reaches a level shifted from the portion where the base wafer and the lid wafer are bonded to each other toward a second surface of the base wafer, along the boundary between adjacent fragmentation regions of the device wafer, placing a resin material in the first groove, and forming a second groove, which passes through the device wafer, along the boundary to fragment the device wafer.

10 Claims, 14 Drawing Sheets

(56) References Cited

U.S. PATENT DOCUMENTS

2012/0247291 A1* 10/2012 Kawada ............ H01L 21/67092
                                                                                 83/33
2016/0027992 A1*  1/2016 Lo ...................... G01L 19/0069
                                                                                  438/51
2018/0248556 A1*  8/2018 Kunitomo ................. H03L 7/00

FOREIGN PATENT DOCUMENTS

| JP | 2007-060484 A |   | 3/2007  |
|----|---------------|---|---------|
| JP | 2008311288 A  | * | 12/2008 |
| JP | 2009100436 A  | * | 5/2009  |
| JP | 2011-172015 A |   | 9/2011  |
| JP | 2011182203 A  | * | 9/2011  |
| JP | 2018-117243 A |   | 7/2018  |
| KR | 102207617 B1  | * | 1/2021  |

\* cited by examiner

METHOD FOR MANUFACTURING VIBRATION DEVICE

The present application is based on, and claims priority from JP Application Serial Number 2021-074356, filed Apr. 26, 2021, the disclosure of which is hereby incorporated by reference herein in its entirety.

BACKGROUND

1. Technical Field

The present disclosure relates to a method for manufacturing a vibration device.

2. Related Art

The piezoelectric vibrator described in JP-A-2018-117243 includes a package having a configuration in which a lid and a base are bonded to each other via a bonding member, a vibration element accommodated in an accommodation section that is an internal space of the package, and a cover member that covers the portion where the lid and the base are bonded to each other to protect the portion from moisture. The cover member is formed by fragmenting piezoelectric vibrators in the form of a wafer and then applying a resin material to each of the piezoelectric vibrators.

The method for forming the cover member by applying a resin material to each of the individual fragmented piezoelectric vibrators, however, has a problem of an increase in the number of steps required to manufacture the cover member.

SUMMARY

A method for manufacturing a vibration device according to an aspect of the present disclosure includes preparing a base wafer having a first surface and a second surface that are in front-back relation and including a plurality of fragmentation regions, placing a vibration element on a side facing the first surface of the base wafer for each of the fragmentation regions, producing a device wafer in which a housing that accommodates the vibration element is formed in each of the fragmentation regions by preparing a lid wafer having the plurality of fragmentation regions and bonding the lid wafer to the first surface of the base wafer, forming a first groove, which starts from the lid wafer and reaches a level shifted from a portion where the base wafer and the lid wafer are bonded to each other toward the second surface, along a boundary between adjacent fragmentation regions of the plurality of fragmentation regions of the device wafer, placing a resin material in the first groove, and forming a second groove, which has a width smaller than a width of the first groove and passes through the device wafer, along the boundary to fragment the device wafer in accordance with the fragmentation regions so as to produce a plurality of vibration devices.

DESCRIPTION OF EXEMPLARY EMBODIMENTS

Preferable embodiments of a method for manufacturing a vibration device will be described below with reference to the accompanying drawings. The upper side in FIG. 1, FIGS. 4 to 15, and FIGS. 17 to 21 is also called "above", and the lower side in the figures is also called "below" for convenience of description. In this case, in FIG. 2, the near side of the plane of view is "above", and the far side of the plane of view is "below".

First Embodiment

Figure 1:
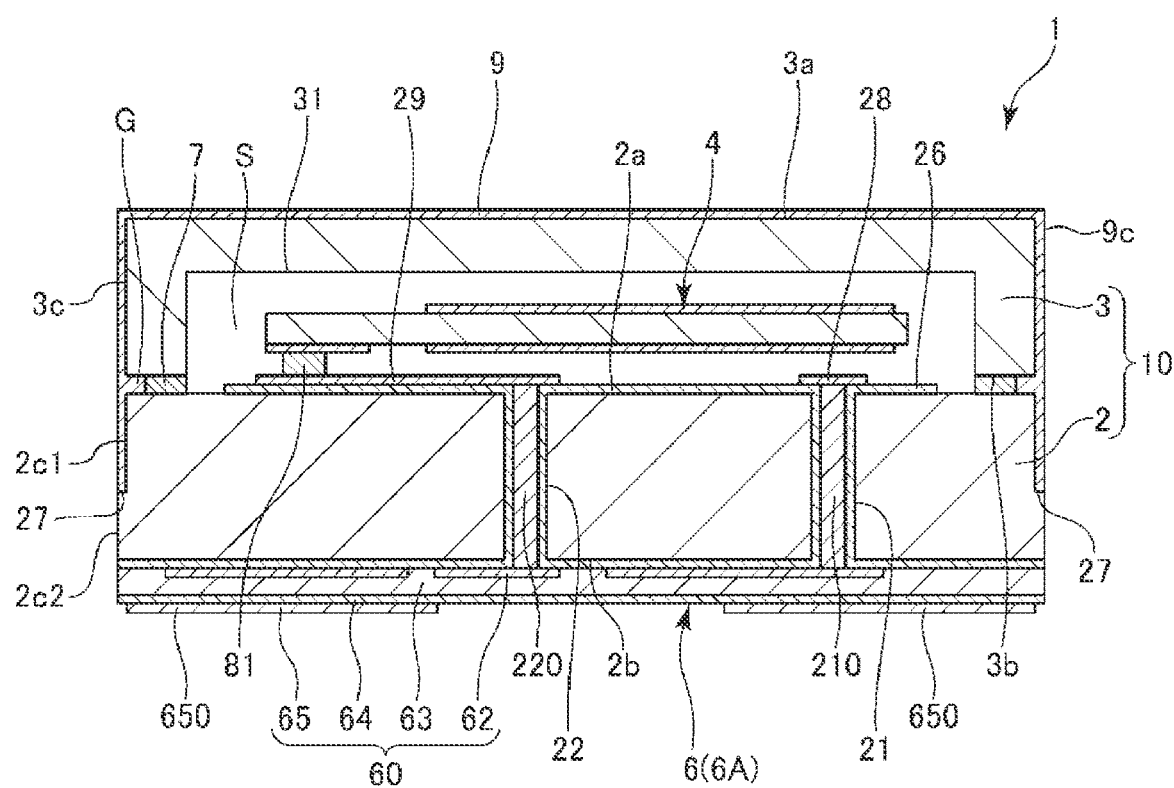
FIG. 1 is a cross-sectional view showing a vibration device according to a first embodiment taken along the line A-A in FIG. 2.
Figure 2:
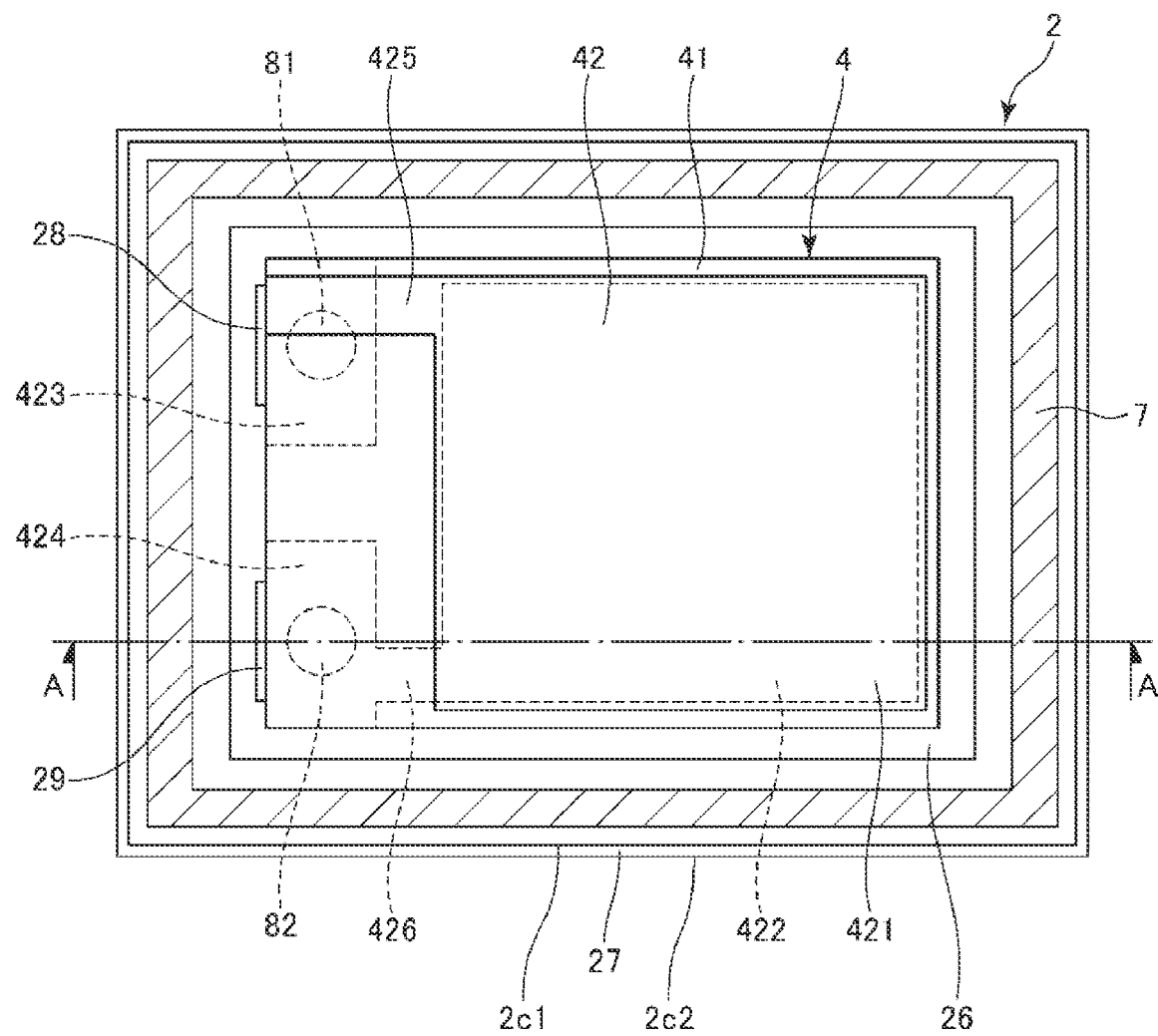
FIG. 2 is a plan view showing the upper surface of a base.
Figure 3:
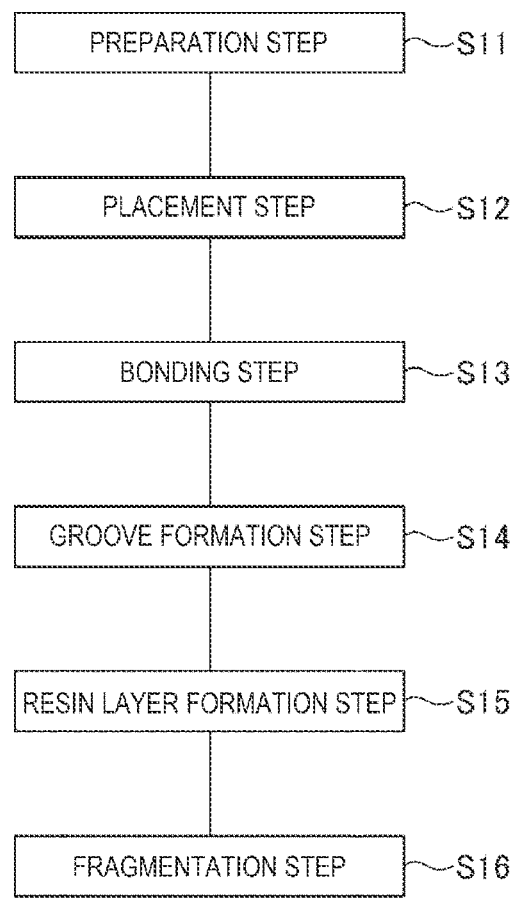
FIG. 3 is a step diagram showing the steps of manufacturing the vibration device.

FIG. 1 is a cross-sectional view showing a vibration device according to a first embodiment taken along the line A-A in FIG. 2. FIG. 2 is a plan view showing the upper surface of a base. FIG. 3 is a step diagram showing the steps of manufacturing the vibration device. FIGS. 4 to 14 are cross-sectional views for describing a method for manufacturing the vibration device.

A vibration device 1 shown in FIG. 1 includes a package 10 having an airtight housing S, a vibration element 4 housed in the housing S, and a resin layer 9 disposed at part of the outer surface of the package 10. The package 10 includes a base 2, to which the vibration element 4 is bonded via a pair of metal bumps 81 and 82, and a lid 3, which covers the vibration element 4 and is bonded to an upper surface 2a of the base 2. An integrated circuit 6 including an oscillation circuit 6A, which causes the vibration element 4 to oscillate, is formed on the side facing a lower surface 2b side of the base 2.

The base 2 is a silicon substrate. In the present embodiment, a P-type silicon substrate is particularly used as the base 2. Therefore, when the vibration device 1 is used, the base 2 is coupled to ground having fixed potential. It is, however, noted that the base 2 is not limited to a specific substrate and may instead be an N-type silicon substrate. Still instead, the base 2 may be a semiconductor substrate that is not made of silicon, for example, a semiconductor substrate made of Ge, GaP, GaAs, InP, or any other suitable substance.

The base 2 has the shape of a plate and has the upper surface 2a as a first surface and the lower surface 2b as a second surface, which are a front surface and a rear surface, respectively. The base 2 has a step 27 in the middle of the thickness direction, and the portion extending from the step 27 toward the upper surface 2a is smaller in diameter than the portion extending from the step 27 toward the lower surface 2b. In the following description, the side surfaces above the step 27 are called side surfaces 2c1, and the side surfaces below the step 27 are called side surfaces 2c2.

An insulating film 26 is formed at the upper surface 2a and lower surface 2b of the base 2. The insulating film 26 is, for example, a silicon oxide film formed by thermal oxidization of the surfaces of the base 2. The insulating film 26 is, however, not limited to a specific film and may instead, for example, be a silicon nitride film. A method for forming the insulating film 26 is not limited to thermal oxidation and may instead, for example, be chemical vapor deposition (CVD).

The integrated circuit 6, which is electrically coupled to the vibration element 4, is formed on the side facing the lower surface 2b of the base 2. Forming the integrated circuit 6 at the base 2 as described above allows effective use of the base 2. In particular, forming the integrated circuit 6 on the side facing the lower surface 2b allows a wider space where the integrated circuit 6 is formed than in a case where the integrated circuit 6 is formed on the side facing the upper surface 2a, which is the case in a forth embodiment described later, by the size of the region required to bond the base 2 to the lid 3.

The integrated circuit 6 includes the oscillating circuit 6A, which is electrically coupled to the vibration element 4 and generates an oscillation signal, such as a clock signal, by causing the vibration element 4 to oscillate. The integrated circuit 6 may include circuits in addition to the oscillation circuit 6A. An example of the additional circuits may include a processing circuit that processes the output signal from the oscillation circuit 6A, and an example of the processing circuit may be a PLL circuit.

A laminate 60, which is formed of a wiring layer 62, an insulating layer 63, a passivation film 64, and a terminal layer 65 laminated on each other, is provided at the lower surface 2b. A plurality of active elements that are not shown but are formed at the lower surface 2b are electrically coupled to each other via wiring lines provided in the wiring layer 62 to form the integrated circuit 6. The terminal layer 65 has a plurality of mounting terminals 650 electrically coupled to the integrated circuit 6. In the vibration device 1, the integrated circuit 6 is coupled to an external apparatus via the mounting terminals 650.

In the illustrated configuration, the laminate 60 includes one wiring layer 62, but not necessarily, and a plurality of wiring layers 62 may be laminated on each other via the insulation layer 63. That is, the wiring layer 62 and the insulating layer 63 may be alternately laminated on each other multiple times. In this case, for example, wiring lines can be routed in the integrated circuit 6 and the plurality of mounting terminals 650 can be disposed with increased degrees of flexibility.

A pair of through holes 21 and 22 are formed in the base 2 and pass through the base 2 in the thickness direction thereof. The through holes 21 and 22 are filled with an electrically conductive material, such as a metal material, to form through electrodes 210 and 220. A pair of wiring lines 28 and 29 electrically coupled to the vibration element 4 are disposed at the upper surface 2a of the base 2. The wiring line 28 is electrically coupled to the integrated circuit 6 via the through electrode 210, and the wiring line 29 is electrically coupled to the integrated circuit 6 via the through electrode 220.

The lid 3 is a silicon substrate, as the base 2 is. The coefficients of linear expansion of the base 2 and the lid 3 are therefore equal to each other, so that thermal stress caused by thermal expansion is suppressed, whereby the vibration device 1 has excellent vibration characteristics. Furthermore, the vibration device 1 can be formed in a semiconductor process, whereby the vibration device 1 can be manufactured with precision, and the size of the vibration device 1 can be reduced. The lid 3 is not necessarily made of a specific material, and a semiconductor substrate that is not made of silicon, for example, a semiconductor substrate made of Ge, GaP, GaAs, InP, or any other suitable substance may be used as the lid 3.

The lid 3 has the shape of a box and has an upper surface 3a, a lower surface 3b, and a bottomed recess 31, which opens via the lower surface 3b and accommodates the vibration element 4, as shown in FIG. 1. In the plan view, the lid 3 is slightly smaller than the base 2, and side surfaces 3c of the lid 3 are flush with the side surfaces 2c1 of the base 2, which are the side surfaces above the step 27.

The lid 3, specifically, the lower surface 3b thereof is bonded to the upper surface 2a of the base 2 via a metal layer 7. The base 2 and the lid 3 are bonded to each other via the metal layer 7 and can therefore be firmly and intimately bonded to each other. Therefore, the strength of the package 10 can be increased, and the airtightness of the housing S can be enhanced. A specific bonding method will be described later in the description of the manufacturing method section.

The lid 3 is electrically coupled to the base 2 via the metal layer 7. Since the base 2 is coupled to ground when the vibration device 1 is used as described above, the lid 3 is also coupled to the ground. The package 10 as a whole thus functions as a shield, whereby influence of electromagnetic noise from the outside environment can be reduced. The vibration device 1 therefore has high reliability.

In the plan view of the package 10, the outer edge of the metal layer 7 is located inside the outer edge of the upper surface 2a of the base 2 and the outer edge of the lower surface 3b of the lid 3. A recessed gap G, which is formed between the upper surface 2a of the base 2 and the lower surface 3b of the lid 3 and faces the space outside the package 10, is therefore formed outside the metal layer 7. The configuration described above can protect the metal layer 7 from dicing operation performed when the vibration device 1 is manufactured. A decrease in the strength of the portion where the base 2 and the lid 3 are bonded to each other and breakdown of the airtightness of the housing S can therefore be effectively suppressed. This point will be described later also in the description of the method for manufacturing the vibration device 1.

The housing section S in the package 10 is airtightly sealed and has a decompressed state, preferably, a state closer to a vacuum. Therefore, the viscosity resistance inside the housing S is lowered, and oscillation characteristics of the vibration element 4 are improved. The housing section S, however, does not necessarily have a specific atmosphere and may have an atmosphere containing an inert gas, such as nitrogen and Ar, and does not necessarily have a decompressed state and may have an atmospheric or pressurized state.

The vibration element 4 includes a vibration substrate 41 and an electrode 42 disposed at the surface of the vibration substrate 41, as shown in FIG. 2. The vibration substrate 41 operates in a thickness-shear vibration mode and is formed of an AT-cut quartz substrate in the present embodiment. The AT-cut quartz substrate has tertiary frequency-temperature characteristics and therefore forms a vibration element 4 having excellent temperature characteristics. The electrode 42 includes an excitation electrode 421, which is disposed at the upper surface of the vibration substrate 41, and an excitation electrode 422, which is disposed at the lower surface of the vibration substrate 41 so as to face the excitation electrode 421. The electrode 42 further includes a pair of terminals 423 and 424 disposed at the lower surface of the vibration substrate 41, a wiring line 425, which electrically couples the terminal 423 to the excitation electrode 421, and a wiring line 426, which electrically couples the terminal 424 to the excitation electrode 422.

The configuration of the vibration element 4 is not limited to the configuration described above. For example, the vibration element 4 may be a mesa-type vibration element in which a vibration region sandwiched between the excitation electrodes 421 and 422 protrudes from the portion around the vibration region or may conversely be an inverted-mesa-type vibration element in which the vibration area is recessed from the portion therearound. A peripheral portion of the vibration substrate 41 may be ground in a beveling process, or the vibration substrate 41 may undergo a convex-shape forming process of producing convexly curved upper and lower surfaces.

The vibration element 4 does not necessarily vibrate in the thickness-shear vibration mode and may, for example, be a vibration element having a plurality of oscillation arms that undergo bending vibration in the in-plane direction, such as a tuning-fork-shaped vibration element. That is, the vibration substrate 41 is not necessarily formed of an AT-cut quartz substrate and may instead be formed of a quartz substrate other than an AT-cut quartz substrate, for example, an X-cut quartz substrate, a Y-cut quartz substrate, a Z-cut quartz substrate, a BT-cut quartz substrate, an SC-cut quartz substrate, or an ST-cut quartz substrate.

The vibration substrate 41 is not necessarily made of quartz and may instead be made, for example, of lithium niobate, lithium tantalate, lithium tetraborate, langacite, potassium niobate, gallium phosphate, or any other piezoelectric single crystal or a piezoelectric single crystal made of a substance other than those described above. Furthermore, the vibration element 4 is not limited to a piezoelectrically driven vibration piece and may be an electrostatically driven vibration piece using electrostatic force.

The vibration element 4 is bonded to the upper surface 2a of the base 2 via the pair of metal bumps 81 and 82 and electrically coupled to the wiring lines 28 and 29, as shown in FIG. 2. The metal bumps 81 and 82 are, for example, stud bumps or plated bumps. The metal bumps 81 and 82 are bonded to the wiring lines 28 and 29, for example, by ultrasonic bonding and bonded to the terminals 423 and 424 by thermocompression bonding. The bonding method is, however, not limited to a specific method. The vibration element 4 may be bonded with an electrically conductive adhesive in place of the metal bumps 81 and 82.

The resin layer 9 is disposed at the outer surface of the package 10, as shown in FIG. 1. Specifically, the resin layer 9 covers a region of the package 10, the entire region above the step 27 formed as part of the base 2. That is, the resin layer 9 covers the step 27 and the side surfaces 2c1 of the base 2, the portion where the base 2 and the lid 3 are bonded to each other, and the entire lid 3. Providing the resin layer 9 at the outer surface of the package 10 as described above allows the resin layer 9 to absorb and mitigate external forces, such as impact produced when the vibration element 4 is dropped and stress induced when the vibration element 4 is picked up, whereby the package 10 is unlikely to receive the external forces. Breakage of the package 10, in particular, cracking and chipping thereof can therefore be effectively suppressed, whereby the vibration device 1 excels in mechanical strength.

The effect of protecting the vibration element 4 from the impact becomes particularly remarkable by covering the corners of the package 10 with the resin layer 9. In the present embodiment, the corners where the upper surface 3a and the side surfaces 3c of the lid 3 meet and the corners where the side surfaces 3c meet are covered with the resin layer 9. The effect of protecting the vibration element 4 from the stress induced when the vibration element 4 is picked up becomes particularly remarkable by covering the side surfaces of the package 10 with the resin layer 9.

Providing the resin layer 9 at the outer surface of the package 10 further increases the coefficient of friction of the surfaces of the vibration device 1 as compared with a case where the package 10 is bare, whereby the vibration device 1 is not slippery but is readily picked up.

The resin layer 9 covers the bonded portion where the lid 3 and the base 2 are bonded to each other, and the gap G is filled with the resin layer 9. The bonded portion can thus be protected. Furthermore, the strength of the bonded portion where the lid 3 and the base 2 are bonded to each other can be further increased, and the airtightness of the housing S can be enhanced. Moreover, the bonded portion serves as an anchor so that the resin layer 9 is unlikely to peel off the package 10. The thus functioning resin layer 9 has insulating properties. Conduction of electricity to the package 10 is therefore avoided, whereby electrostatic breakdown of the integrated circuit 6 caused by external static electricity or other types of external electrical shock can be suppressed. As a result, the vibration device 1 has high reliability.

Side surfaces 9c of the resin layer 9 are flush with the side surfaces 2c2 of the base 2, the side surfaces being below the step 27. The resin layer 9 is therefore unlikely to be caught by an external structure, whereby turning up of the resin layer 9 can be effectively suppressed.

The resin layer 9 is not particularly made of a specific material and can, for example, be made of epoxy resin, phenol resin, urea resin, melamine resin, polyester (unsaturated polyester) resin, polyimide resin, silicone resin, or polyurethane resin, and one or more of the resins described above can be mixed with each other. The resin layer 9 thus excels in heat resistance.

The configuration of the vibration device 1 has been described above. The method for manufacturing the vibration device 1 will next be described. The steps of manufacturing the vibration device 1 include a preparation step S11, a placement step S12, a bonding step S13, a groove formation step S14, a resin layer formation step S15, and a fragmentation step S16, as shown in FIG. 3. The steps S11 to S16 will be described below in detail.

Preparation Step S11

Figure 4:
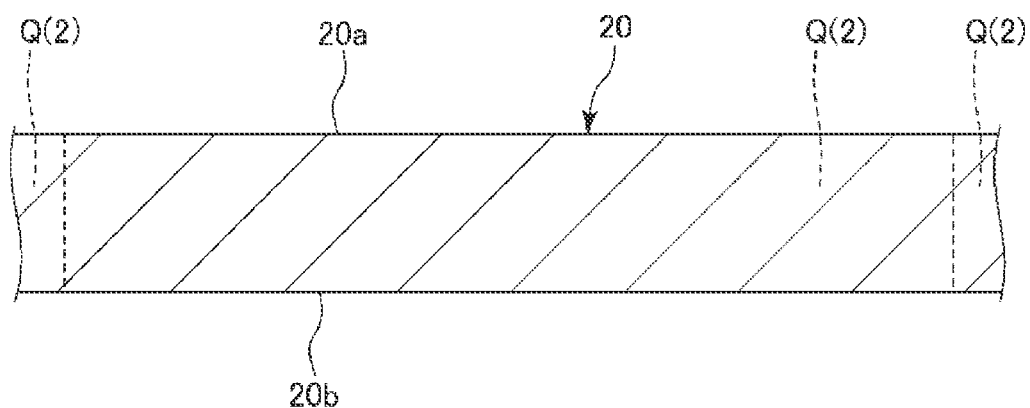
FIG. 4 is a cross-sectional view for describing a method for manufacturing the vibration device.
Figure 5:
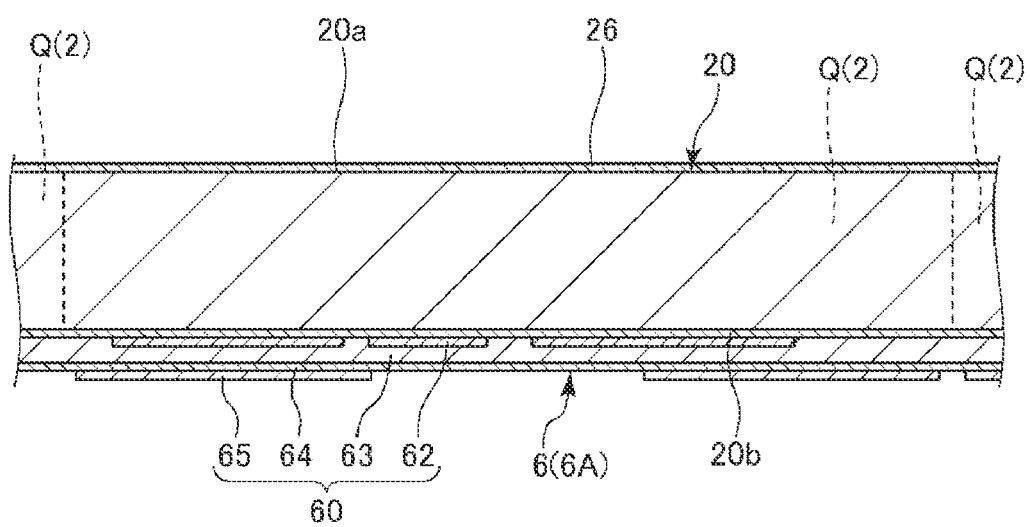
FIG. 5 is a cross-sectional view for describing the method for manufacturing the vibration device.
Figure 6:
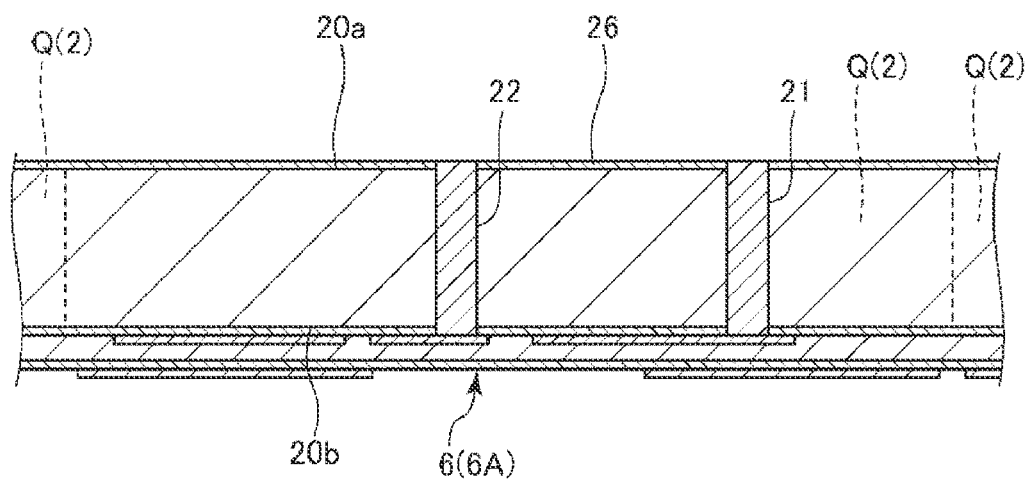
FIG. 6 is a cross-sectional view for describing the method for manufacturing the vibration device.
Figure 7:
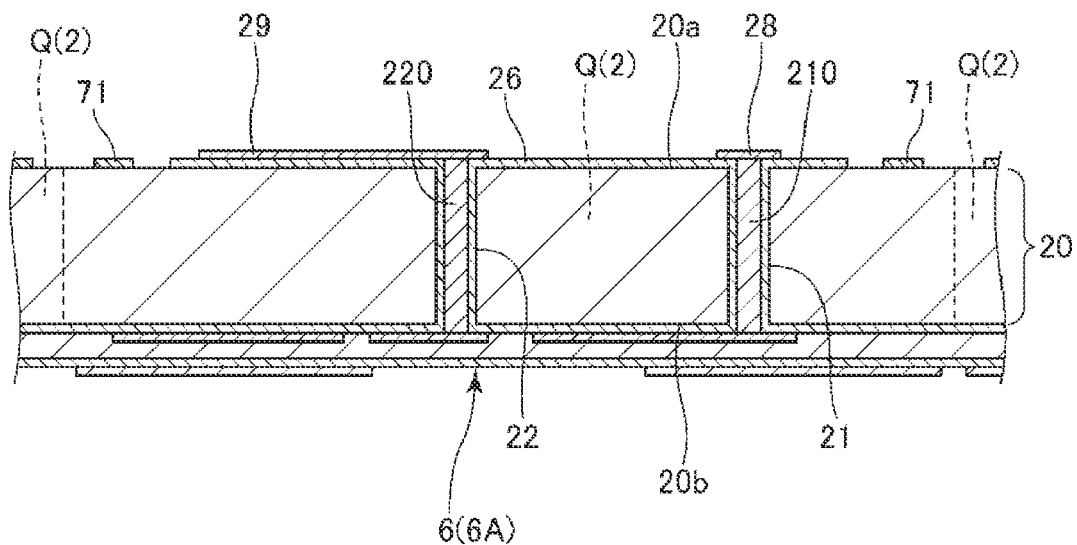
FIG. 7 is a cross-sectional view for describing the method for manufacturing the vibration device.

First, a base wafer 20 is prepared, the base wafer 20 having an upper surface 20a and a lower surface 20b, which are a front surface and a rear surface, respectively, and including a plurality of fragmentation regions Q, that is, a portion that will form the bases 2, as shown in FIG. 4. The base wafer 20 is a base material of the base 2 and is a silicon substrate. The integrated circuit 6 is then formed on the side facing the lower surface 20b of the base wafer 20 for each of the fragmentation regions Q, as shown in FIG. 5. The through holes 21 and 22, which start from the upper surface of the base wafer 20 and reach the integrated circuit 6, are then formed in each of the fragmentation regions Q, as shown in FIG. 6. The through electrodes 210 and 220, the wiring lines 28 and 29, and a first metal layer 71 are then formed for each of the fragmentation regions Q, as shown in FIG. 7. Forming the integrated circuits 6 in the base wafer 20 as described above allows effective use of the base wafer 20.

Placement Step S12

Figure 8:
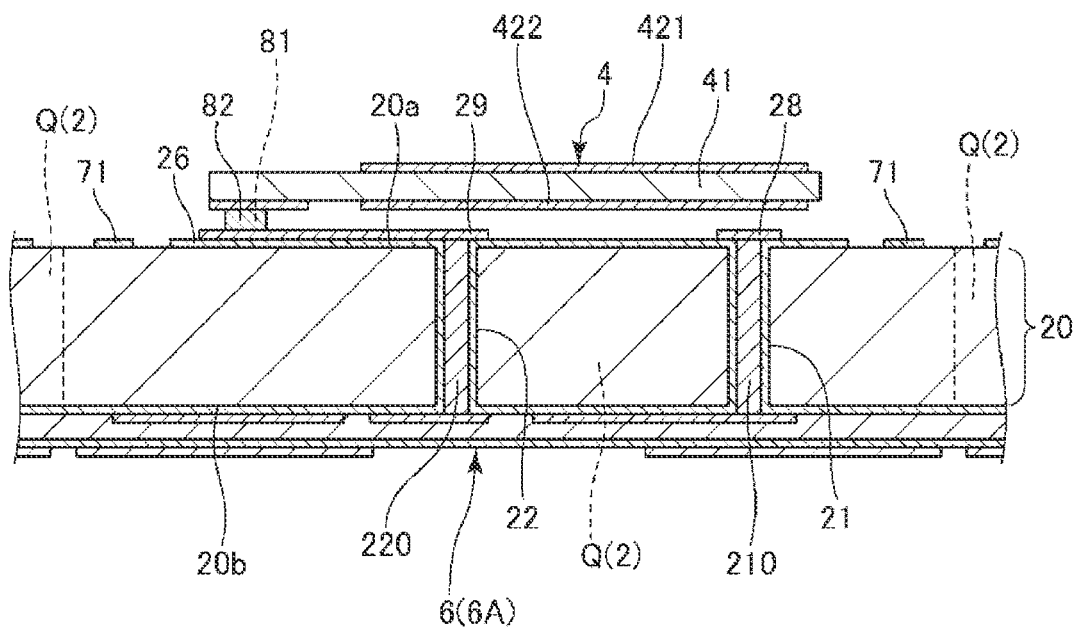
FIG. 8 is a cross-sectional view for describing the method for manufacturing the vibration device.

The vibration element 4 is placed on the side facing the upper surface 20a of the base wafer 20 for each of the fragmentation regions Q, as shown in FIG. 8. Specifically, the vibration element 4 is prepared and bonded to the upper surface 20a via the metal bumps 81 and 82. The wiring line 28 is electrically coupled to the terminal 423 of the vibration element 4 via the metal bump 81, and the wiring line 29 is electrically coupled to the terminal 424 of the vibration element 4 via the metal bump 82. The vibration element 4 is thus electrically coupled to the integrated circuit 6.

Bonding Step S13

Figure 9:
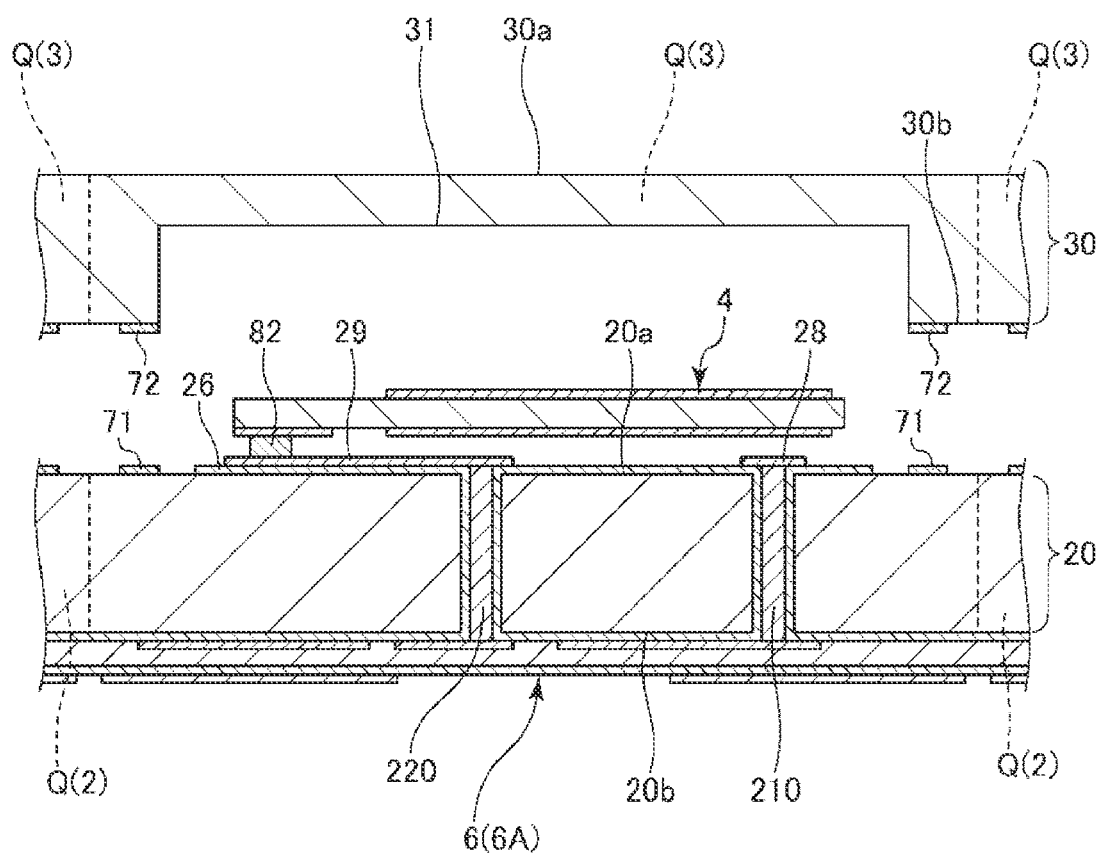
FIG. 9 is a cross-sectional view for describing the method for manufacturing the vibration device.

First, a lid wafer 30 including the plurality of fragmentation regions Q, that is, a portion that will form the lids 3 is prepared, as shown in FIG. 9. The following portions are formed in the lid wafer 30 for each of the fragmentation regions Q: the recess 31, which opens via a lower surface 30b; and a second metal layer 72, which is disposed at the lower surface 30b so as to surround the recess 31. The first metal layer 71 and the second metal layer 72 can each have a configuration, for example, in which a surface layer made of gold (Au) is layered on a ground layer made of copper (Cu).

Figure 10:
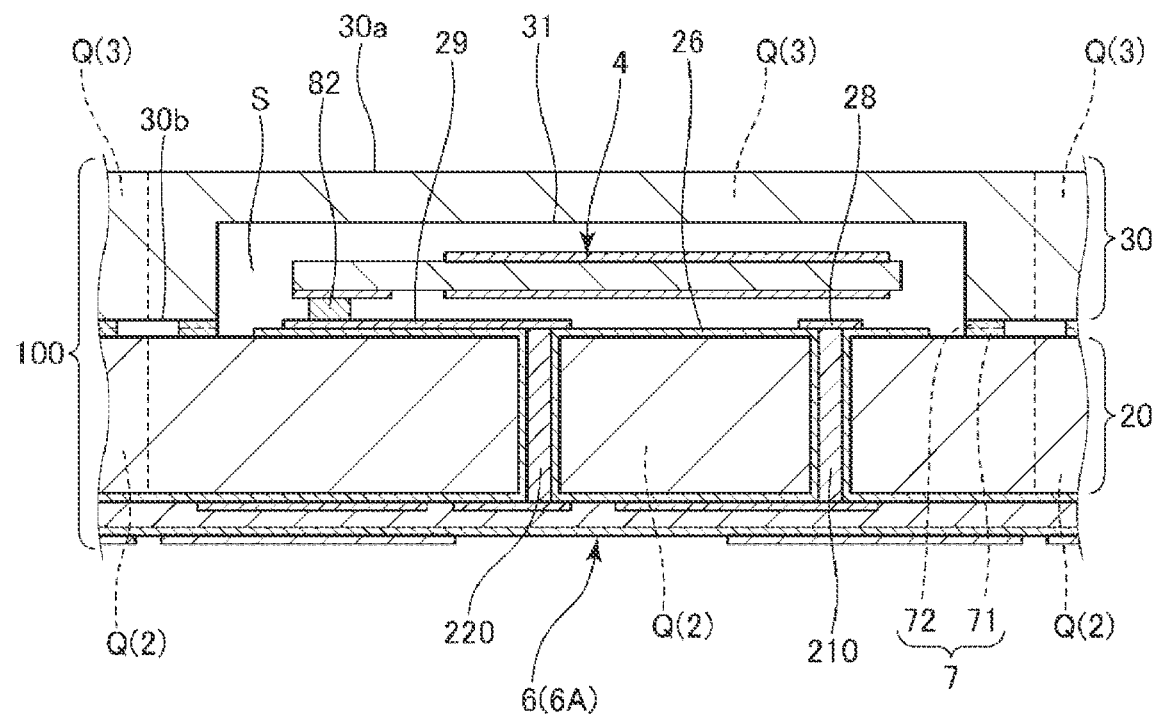
FIG. 10 is a cross-sectional view for describing the method for manufacturing the vibration device.

An ion beam or plasma is then radiated onto the surfaces of the first metal layer 71 and the second metal layer 72 to activate the surfaces of the first metal layer 71 and the second metal layer 72 so that the metals of the first metal layer 71 and the second metal layer 72 are diffused to bond the base wafer 20 to the lid wafer 30, as shown in FIG. 10. The diffusion in the first metal layer 71 and the second metal layer 72 allows formation of the metal layer 7. A device wafer 100, in which the housing S housing the vibration element 4 is formed for each of the fragmentation regions Q, is thus provided. In the device wafer 100, the base wafer 20 and the lid wafer 30 are electrically coupled to each other via the metal layer 7.

The bonding method described above allows the base wafer 20 and the lid wafer 30 to be bonded to each other more firmly and intimately and the mechanical strength and airtightness of the vibration device 1 to be enhanced. Furthermore, since the base 2 and the lid 3 can be bonded to each other at room temperature (temperature lower than melting point of first metal layer 71 and second metal layer 72), internal stress is unlikely to remain in the package 10, and thermal damage to the vibration element 4 is also reduced.

Figure 11:
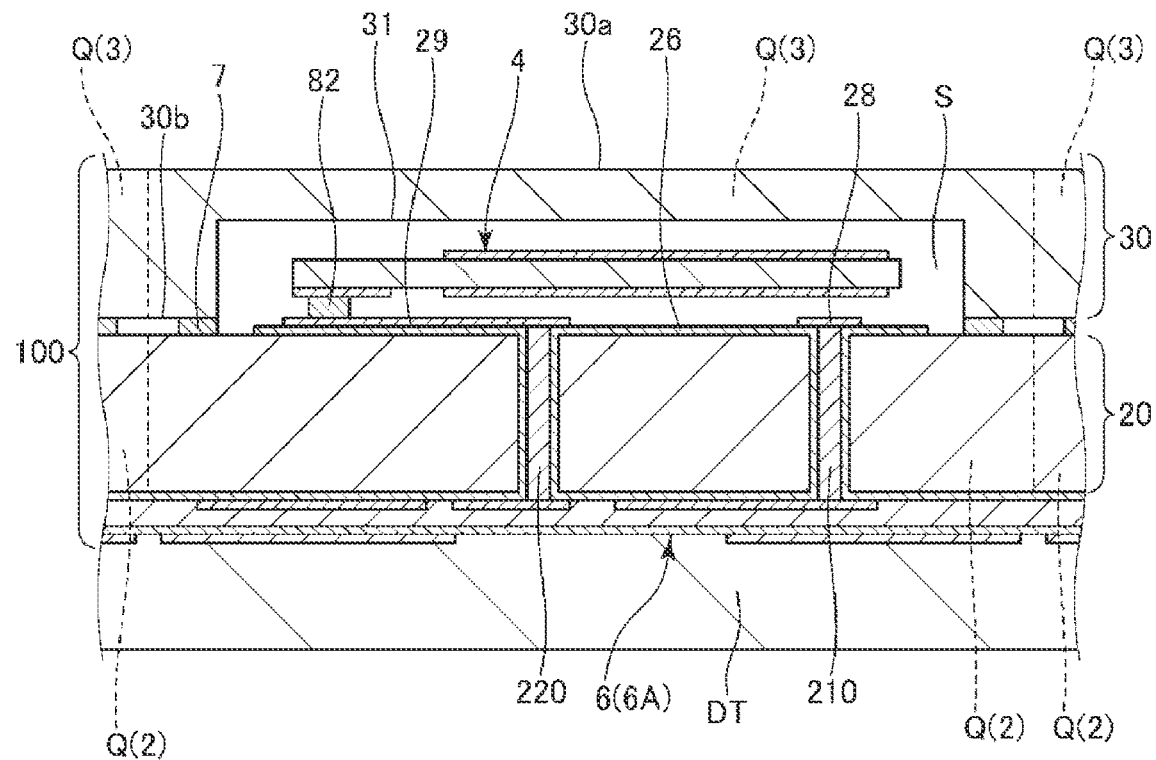
FIG. 11 is a cross-sectional view for describing the method for manufacturing the vibration device.

A dicing tape DT as a holding member is then prepared and attached to the side facing the lower surface 20b of the device wafer 100, as shown in FIG. 11. The dicing tape DT thus holds the device wafer 100 from the side facing the lower surface 20b.

Groove Formation Step S14

Figure 12:
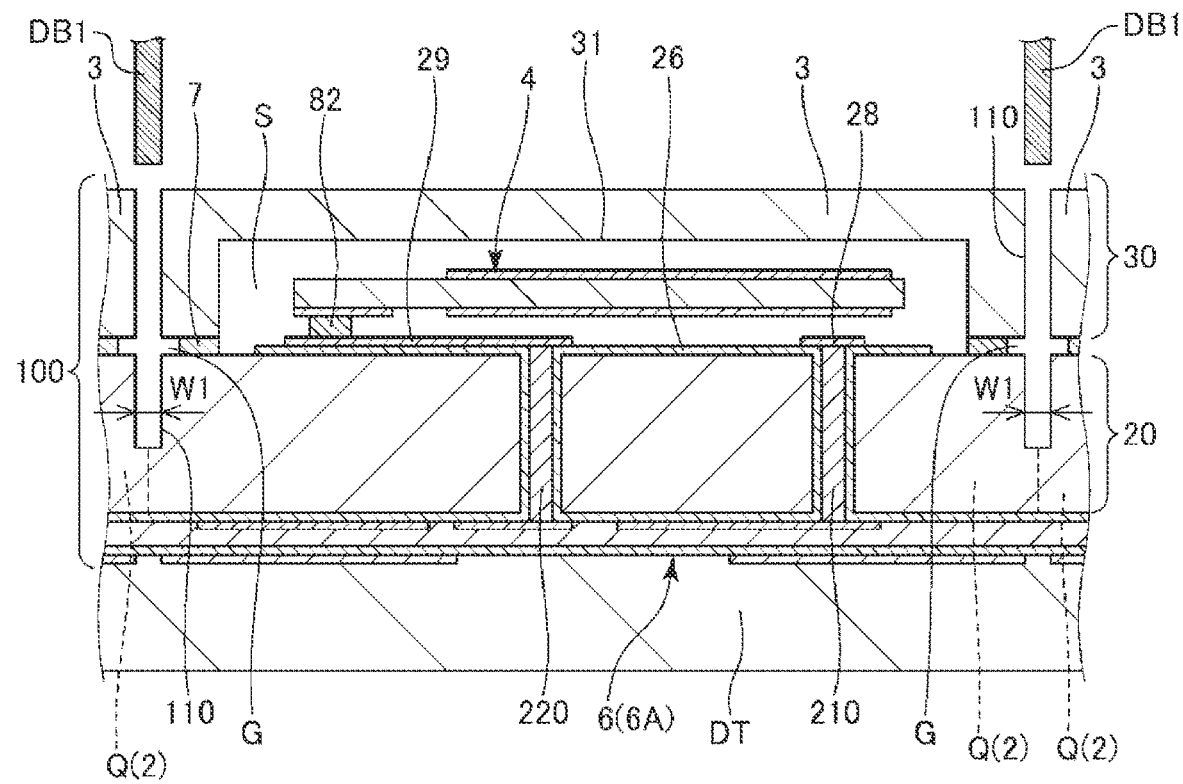
FIG. 12 is a cross-sectional view for describing the method for manufacturing the vibration device.

A first groove 110 is formed from the side facing the lid wafer 30 along the boundary between adjacent fragmentation regions Q, as shown in FIG. 12. The first groove 110 is a bottomed groove that opens via an upper surface 30a of the lid wafer 30 and does not pass through the lower surface 20b of the base wafer 20. The first groove 110 reaches a level shifted from the portion where the base wafer 20 and the lid wafer 30 are bonded to each other toward the lower surface 20b, that is, a level halfway in the base wafer 20. The portion where the base wafer 20 and the lid wafer 30 are bonded to each other therefore faces the first groove 110. The lid wafer 30 is fragmented in accordance with the fragmentation regions Q, so that the lid 3 is formed in each of the fragmentation regions Q.

A method for forming the first groove 110 is not limited to a specific method. In the present embodiment, the first groove 110 is formed by half-dicing using a dicing blade DB1 and performed on the side facing the upper surface 30a of the lid wafer 30. The first groove 110 can thus be readily formed. Since minute irregularities are formed at the surface of the first groove 110, that is, the surface is roughened, adhesion between the package 10 and the resin layer 9 is enhanced.

In the plan view of the device wafer 100, the outer edge of the metal layer 7 is located inside the outer edge of each of the fragmentation regions Q. Therefore, when the first groove 110 is formed with the dicing blade DB1, no contact between the dicing blade DB1 and the metal layer 7 occurs, so that clogging of the dicing blade DB1 can be suppressed. A decrease in accuracy of the processing of the first groove 110 is therefore suppressed. Furthermore, damage to the metal layer 7 can be suppressed, whereby a decrease in the strength of the portion where the base wafer 20 and the lid wafer 30 are bonded to each other, a decrease in the airtightness of the housing S, the breakdown of the airtightness, and other disadvantages can be effectively suppressed.

Resin Layer Formation Step S15

Figure 13:
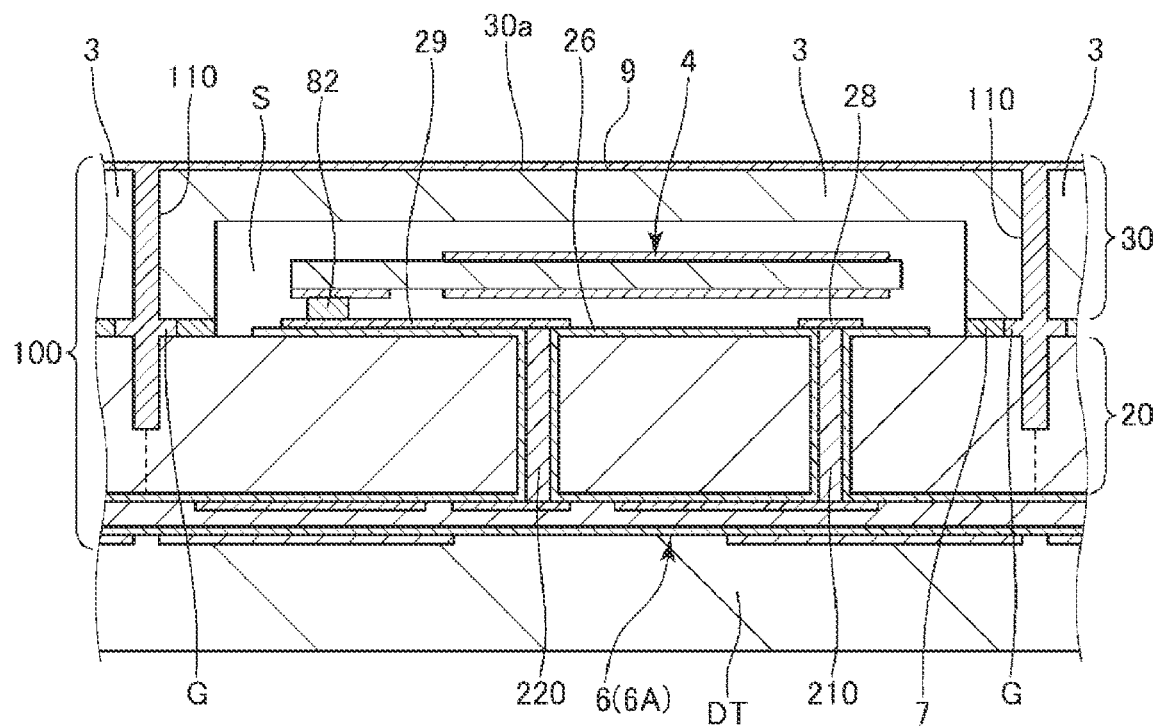
FIG. 13 is a cross-sectional view for describing the method for manufacturing the vibration device.

A resin material is placed at the surface of the device wafer 100 to form the resin layer 9, as shown in FIG. 13. The resin layer 9 is formed at the upper surface 30a of the lid wafer 30 and in the first groove 110. The gap G facing the first groove 110 is also filled with the resin layer 9. Filling the gap G with the resin layer 9 allows protection of the portion where the base wafer 20 and the lid wafer 30 are bonded to each other. Furthermore, the strength of the bonded portion where the base wafer 20 and the lid wafer 30 are bonded to each other can be further increased, and the airtightness of the housing S can also be enhanced. Moreover, the bonded portion serves as an anchor so that the resin layer 9 is unlikely to peel off the device wafer 100. The resin layer 9 can be formed, for example, by spin coating or spray coating.

Since the first groove 110 is a bottomed groove, the device wafer 100 is not fragmented but remains united with the aid of the base wafer 20. The device wafer 100 is therefore rigid enough to withstand stress induced by shrinkage of the resin layer 9 that occurs when it cures, whereby warpage and deflection of the device wafer 100 caused by the stress can be effectively suppressed. Warpage of the device wafer 100 caused by the stress is therefore suppressed, and the following fragmentation step S16 can be carried out more accurately and smoothly.

Fragmentation Step S16

Figure 14:
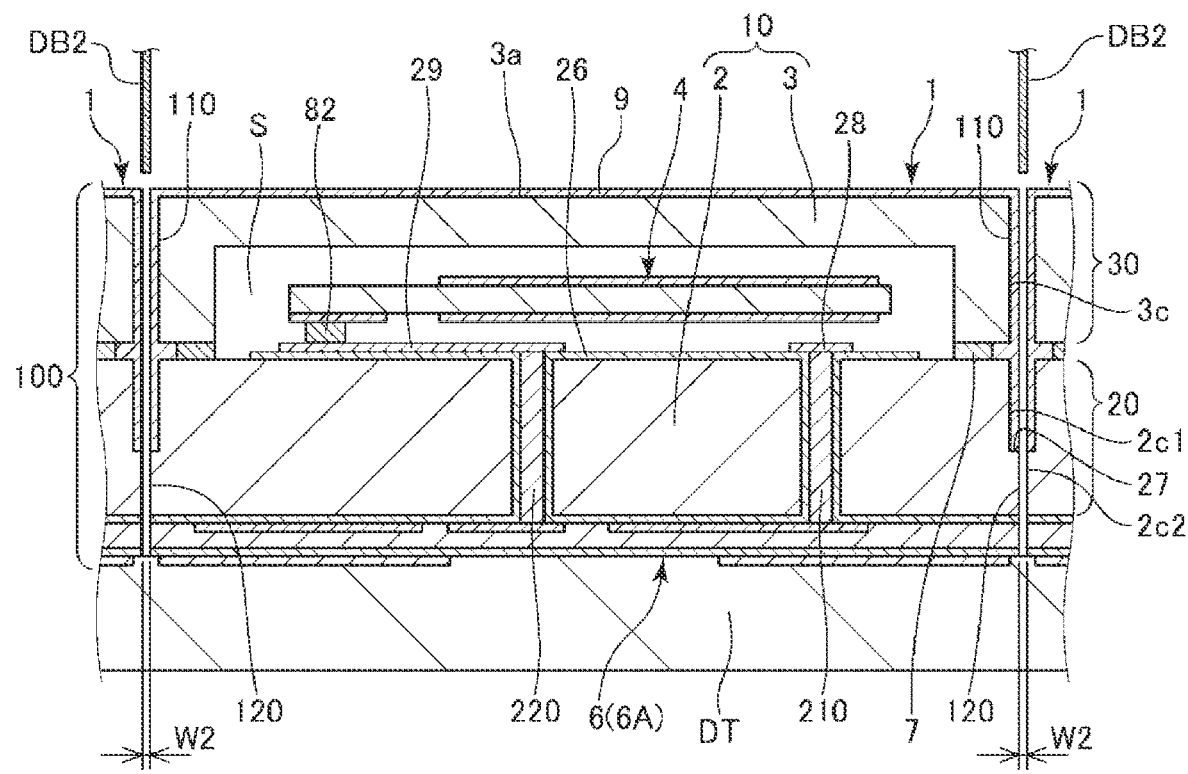
FIG. 14 is a cross-sectional view for describing the method for manufacturing the vibration device.

A second groove 120, which passes through the device wafer 100, is formed along the boundary between the adjacent fragmentation regions Q, to fragment the device wafers 100 in accordance with the fragmentation regions Q, as shown in FIG. 14. A plurality of the vibration devices 1 are thus collectively formed. A method for forming the second groove 120 is not limited to a specific method. In the present embodiment, the second groove 120 is formed by dicing using a dicing blade DB2 and performed on the side facing the lid wafer 30. The second groove 120 can thus be readily formed. In particular, performing the dicing from the side facing the lid wafer 30 prevents the dicing blade DB2 from cutting the dicing tape DT, and all the fragmented vibration devices 1 are held on the dicing tape DT. Separation of the plurality of vibration devices 1 from each other can thus be avoided.

The dicing blade DB2 is thinner than the dicing blade DB1, so that a width W2 of the second groove 120 is smaller than a width W1 of the first groove 110. That is, W2<W1 is satisfied. The resin layer 9 therefore remains at the side surfaces of each of the fragmented packages 10, and the vibration devices 1 in each of which the entire area above the step 27 is covered with the resin layer 9 are provided, as shown in FIG. 14.

The method for manufacturing the vibration device 1 has been described above. The method for manufacturing the vibration device 1 includes, as described above, the preparation step S11, which is the step of preparing the base wafer 20 having the upper surface 20a, which is the first surface and a front surface, and the lower surface 20b, which is the second surface and a rear surface with respect to the front surface, and including the plurality of fragmentation regions Q, the placement step S12, which is the step of placing the vibration element 4 on the side facing the upper surface 20a of the base wafer 20 for each of the fragmentation regions Q, the bonding step S13, which is the step of producing the device wafer 100, in which the housing S housing the vibration element 4 is formed in each of the fragmentation regions Q, by preparing the lid wafer having the plurality of fragmentation regions Q and bonding the lid wafer 30 to the upper surface 20a of the base wafer 20, the groove formation step S14, which is the step of forming the first groove 110, which starts from the lid wafer 30 and reaches a level shifted from the portion where the base wafer 20 and the lid wafer 30 are bonded to each other toward the lower surface 20b, along the boundary between the adjacent fragmentation regions Q of the device wafer 100, the resin layer formation step S15, which is the step of placing a resin material in the first groove 110, and the fragmentation step S16, which is the step of forming the second groove 120, which has the width W2 smaller than the width W1 of the first groove 110 and passes through the device wafer 100, along the boundary between the adjacent fragmentation regions Q of the device wafer 100 to fragment the device wafer 100 in accordance with the fragmentation regions Q so as to produce a plurality of vibration devices 1. The manufacturing method described above allows the resin layer 9 to be collectively formed on the plurality of vibration devices 1, thus reducing the number of steps required to manufacture the vibration devices. The vibration devices 1 can therefore be readily manufactured.

The first groove 110 is a bottomed groove, as described above. Warpage of the device wafer 100 can therefore be suppressed, whereby the fragmentation step S16 can be carried out more accurately and smoothly.

In the resin layer formation step S15 of placing the resin material, the resin material is also placed at the upper surface 30a of the lid wafer 30, that is, the surface opposite from the base wafer 20, as described above. Since a larger area is thus covered with the resin layer 9, the mechanical strength of the vibration device 1 can be increased.

In the bonding step S13 of bonding the lid wafer 30, the base wafer 20 and the lid wafer 30 are bonded to each other via the metal layer 7, as described above. The outer edge of the metal layer 7 is located inside the outer edge of each of the fragmentation regions Q in the plan view. Therefore, damage to the metal layer 7 in the formation of the first groove 110 can be suppressed, whereby a decrease in the strength of the portion where the base wafer 20 and the lid wafer 30 are bonded to each other, a decrease in the airtightness of the housing S, the breakdown of the airtightness, and other disadvantages can be effectively suppressed.

In the resin layer formation step S15 of placing a resin material, the gap G, which is formed by the metal layer 7 between the base wafer 20 and the lid wafer 30 and faces the first groove 110, is filled with the resin material, as described above. The portion where the base wafer 20 and the lid wafer 30 are bonded to each other can thus be protected. Furthermore, the strength of the bonded portion where the base wafer 20 and the lid wafer 30 are bonded to each other can be further increased, and the airtightness of the housing S can also be enhanced. Moreover, the bonded portion serves as an anchor so that the resin layer 9 is unlikely to peel off the device wafer 100.

The step of forming the first groove 110 is carried out in the state in which the dicing tape DT as the holding member holds the device wafer 100 from the side facing the lower surface 20b, as described above. Therefore, since the entire fragmented vibration devices 1 are held on the dicing tape DT, separation of the vibration devices 1 from each other can be avoided.

The base wafer 20 is a semiconductor substrate, and the oscillation circuit 6A is disposed in each of the fragmentation regions Q of the base wafer 20, as described above. The base wafer 20 can thus be effectively used.

The lid wafer 30 is a semiconductor substrate and is bonded to the base wafer 20 in the bonding step S13 of bonding the lid wafer 30 so as to be electrically coupled to the base wafer 20, as described above. Therefore, for example, coupling the base 2 to the ground when used allows the package 10 to function as a shield, whereby the influence of electromagnetic noise can be reduced.

Second Embodiment

Figure 15:
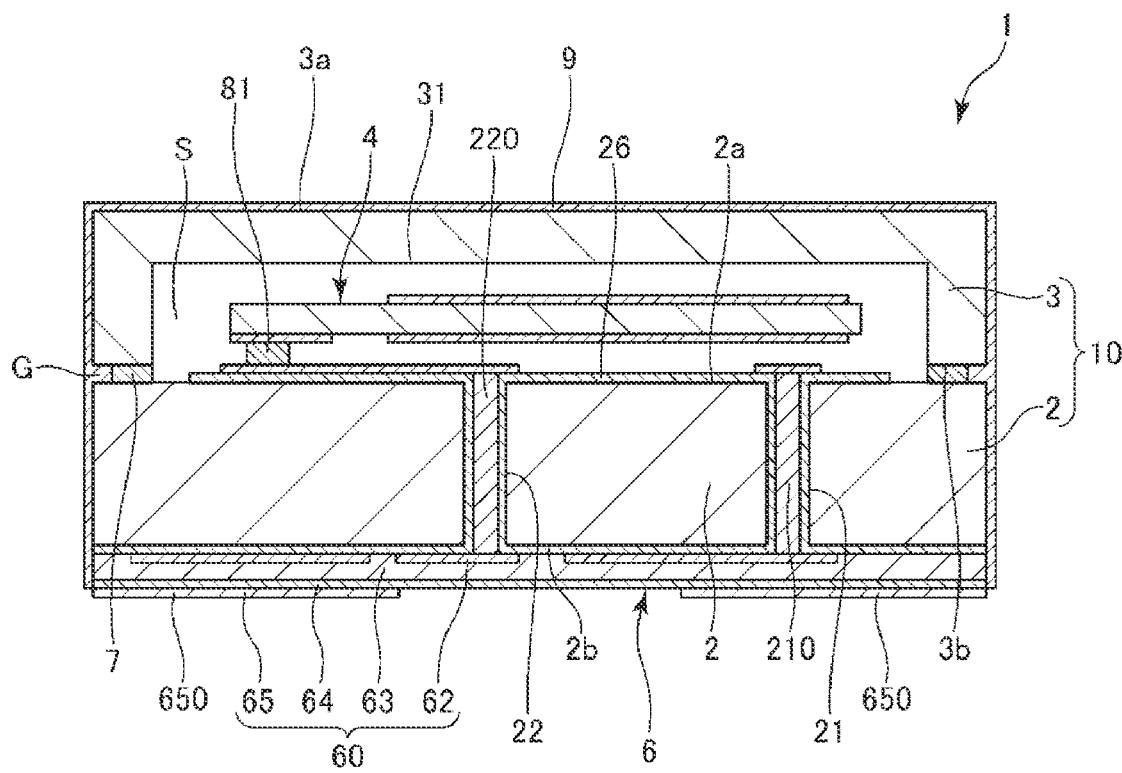
FIG. 15 is a cross-sectional view showing the vibration device according to a second embodiment.
Figure 16:
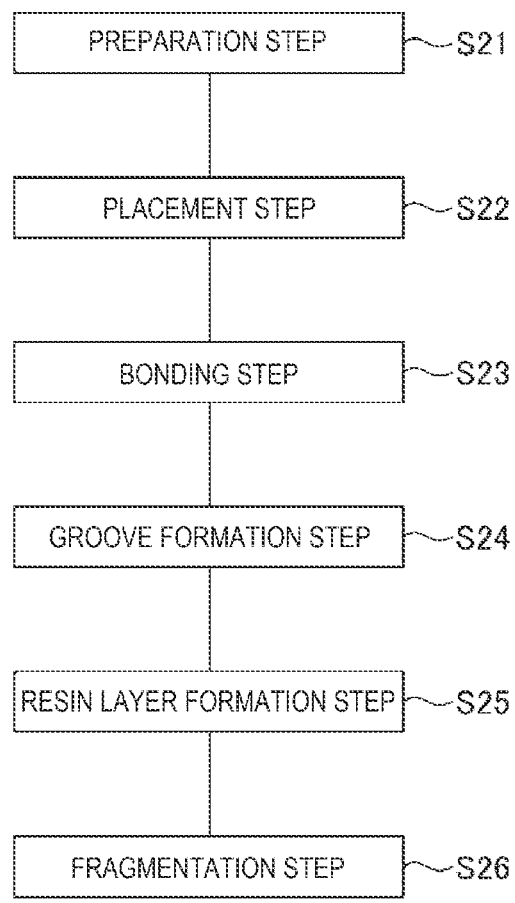
FIG. 16 is a step diagram showing the steps of manufacturing the vibration device.
Figure 17:
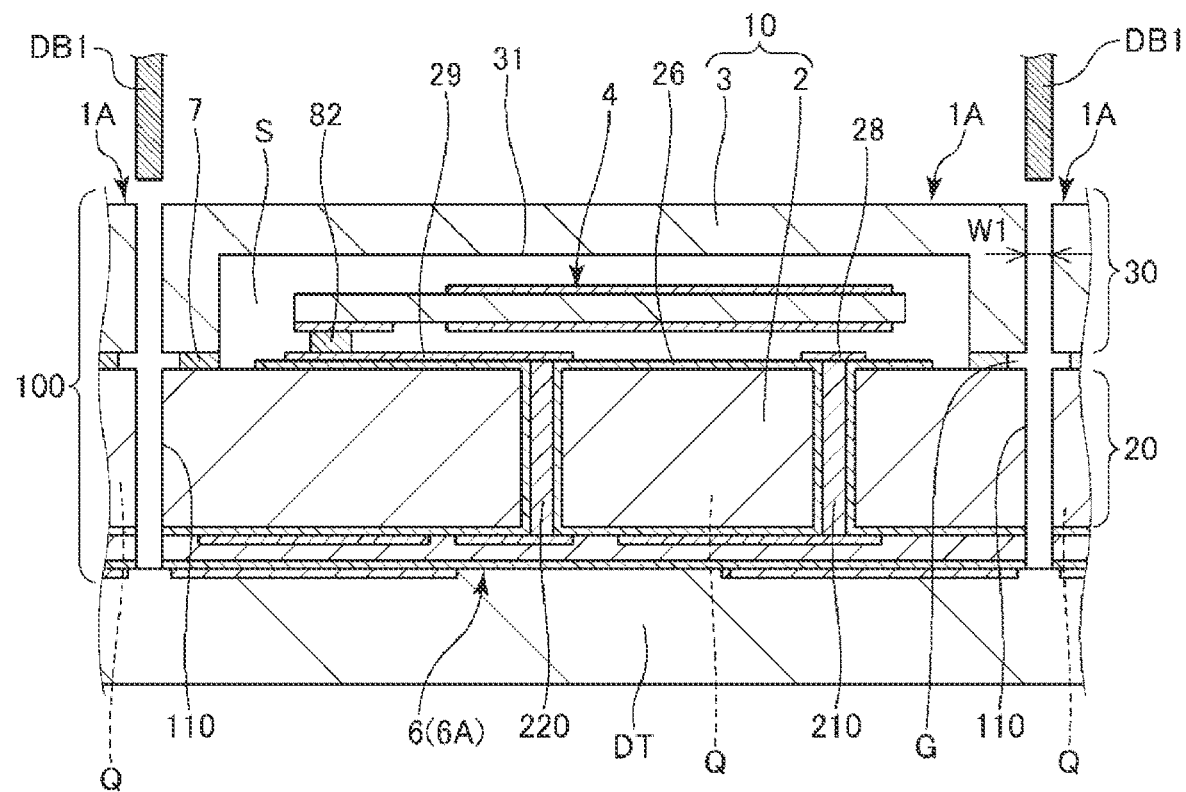
FIG. 17 is a cross-sectional view for describing the method for manufacturing the vibration device.
Figure 18:
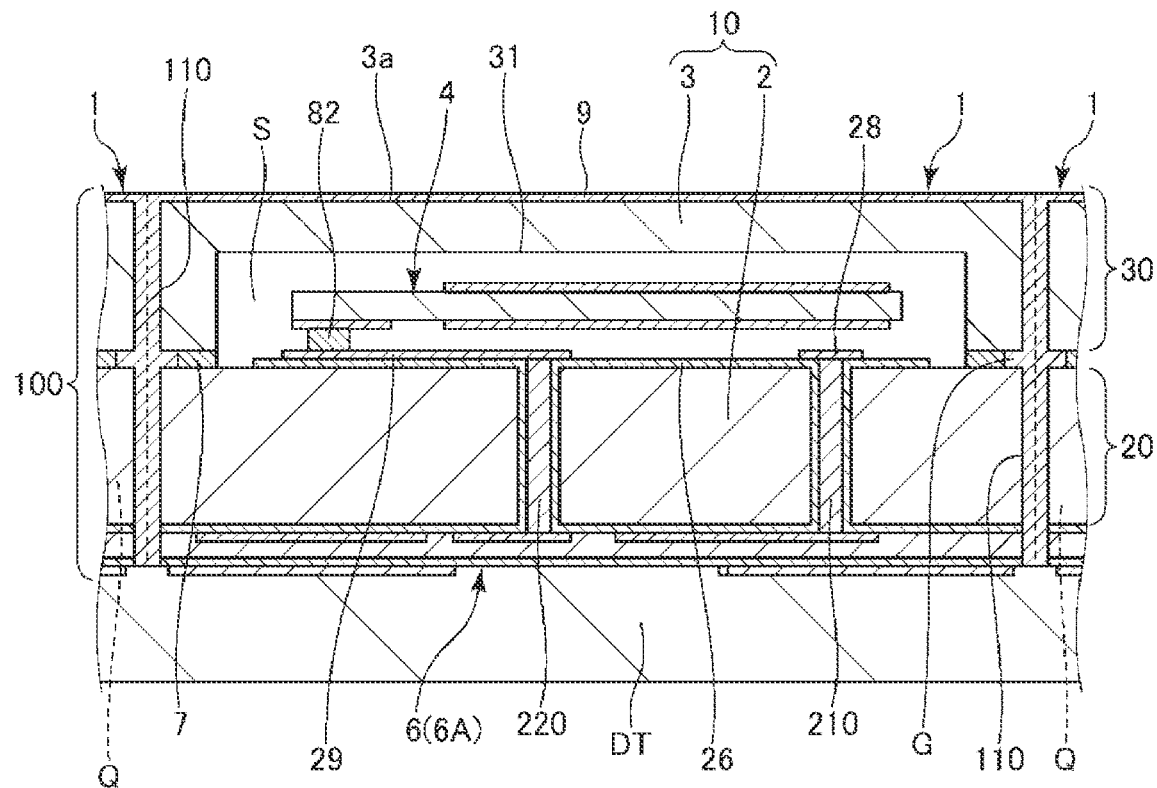
FIG. 18 is a cross-sectional view for describing the method for manufacturing the vibration device.
Figure 19:
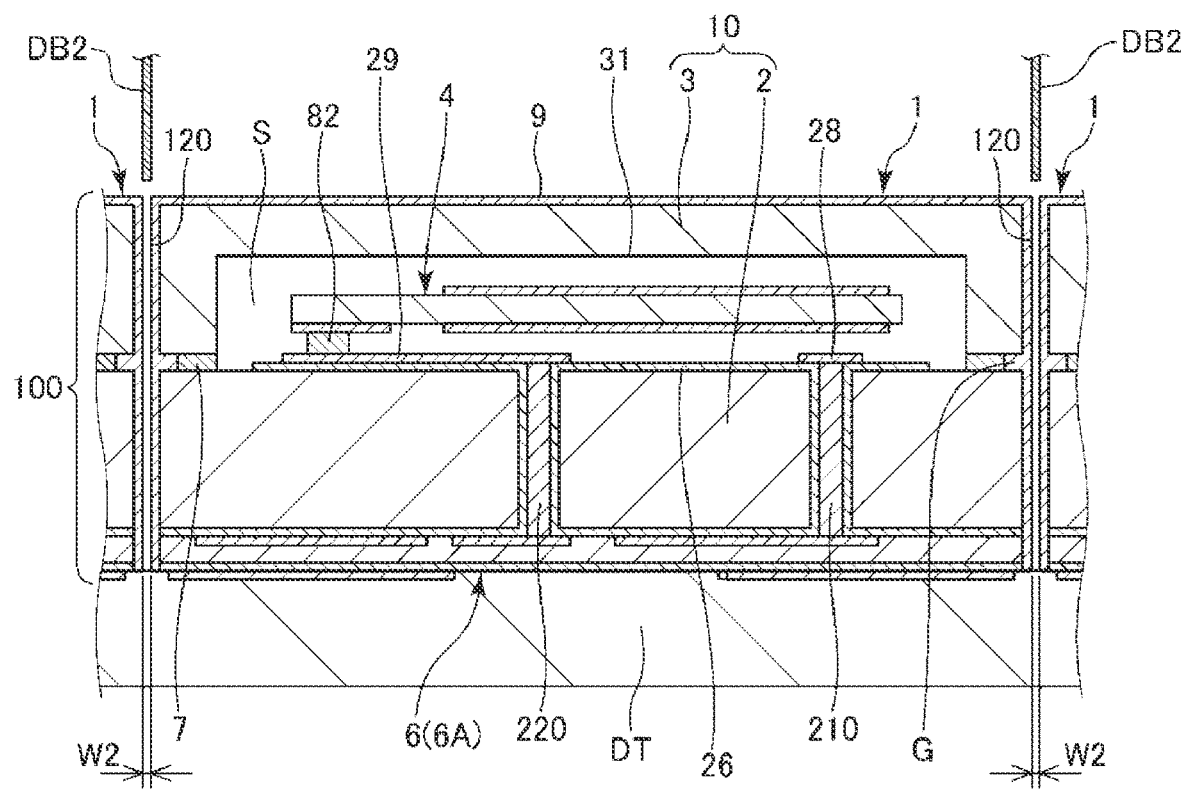
FIG. 19 is a cross-sectional view for describing the method for manufacturing the vibration device.

FIG. 15 is a cross-sectional view showing the vibration device according to a second embodiment. FIG. 16 is a step diagram showing the steps of manufacturing the vibration device. FIGS. 17 to 19 are cross-sectional views for describing the method for manufacturing the vibration device.

The present embodiment is the same as the first embodiment described above except primarily in terms of the shape of the base 2 and the arrangement of the resin layer 9. In the following description, the present embodiment will be described primarily on the differences from the embodiment described above, and the same items as those in the embodiment described above will not be described. In FIGS. 15 to 19, the same configurations as those in the embodiment described above have the same reference characters.

In the vibration device 1 according to the present embodiment, no step 27 is formed at the side surfaces of the base 2, and the entire side surfaces are covered with the resin layer 9, as shown in FIG. 15. That is, the resin layer 9 is disposed at all regions except the lower surface of the outer surface of the package 10. According to the configuration described above, more portions are covered with the resin layer 9 than in the first embodiment described above, whereby the function of the resin layer 9 becomes more remarkable.

A method for manufacturing the vibration device 1 will next be described. The steps of manufacturing the vibration device 1 includes a preparation step S21, a placement step S22, a bonding step S23, a groove formation step S24, a resin layer formation step S25, and a fragmentation step S26, as shown in FIG. 16. The steps S21 to S26 will be described below in detail, and the steps up to the bonding step S23 are same as the steps up to the bonding step S13 in the first embodiment described above. The groove formation step S24 and the following steps will therefore be described below.

Groove Formation Step S24

The device wafer 100 held on the dicing tape DT is diced from the side facing the lid wafer 30 to form the first groove 110, which passes through the device wafer 100, along the boundary between the adjacent fragmentation regions Q, as shown in FIG. 17. The device wafer 100 is thus fragmented in accordance with the fragmentation regions Q, and a plurality of devices 1A are produced. The devices 1A are each a vibration device 1 having no resin layer 9 formed thereon.

The method for forming the first groove 110 is not limited to a specific method. In the present embodiment, the first groove 110 is formed by dicing using the dicing blade DB1 and performed on the side facing the lid wafer 30. The first groove 110 can thus be readily formed. Performing the dicing from the side facing the lid wafer 30 prevents the dicing blade DB1 from cutting the dicing tape DT, and the fragmented devices 1A are held on the dicing tape DT. Separation of the devices 1A from each other can thus be avoided.

Resin Layer Formation Step S25

The resin layer 9 is formed at the surface of each of the devices 1A, as shown in FIG. 18. The vibration devices 1 are thus produced. In the present embodiment, the resin layer 9 is formed at the upper surface 3a of each of the lids 3 and in the first groove 110. That is, the resin layer 9 is formed so as to cover the upper surface and the side surfaces of each of the packages 10. The resin layer 9 is not necessarily formed by using a specific method and can be formed, for example, by spin coating or spray coating.

Fragmentation Step S26

In the state shown in FIG. 18, adjacent vibration devices 1 are integrated with each other via the resin layer 9 formed in the first groove 110. Therefore, in the present step, the second groove 120, which passes through the device wafer 100 (resin layer 9), is formed along the boundary between adjacent fragmentation regions Q to fragment the vibration devices 1, as shown in FIG. 19.

The method for forming the second groove 120 is not limited to a specific method. In the present embodiment, the second groove 120 is formed by dicing using the dicing blade DB2 and performed on the side facing the lid wafer 30. The second groove 120 can thus be readily formed. Performing the dicing from the side facing the lid wafer 30 prevents the dicing blade DB2 from cutting the dicing tape DT, and the fragmented vibration devices 1 are held on the dicing tape DT.

The dicing blade DB2 is thinner than the dicing blade DB1, so that the width W2 of the second groove 120 is smaller than the width W1 of the first groove 110. That is, W2<W1 is satisfied. The resin layer 9 therefore remains at the side surfaces of each of the packages 10 even after the resin layer 9 is cut in the present step, and vibration devices 1 in each of which the entire area excluding the lower surface of the package 10 is covered with the resin layer 9 are provided.

In the method for manufacturing the vibration device 1 according to the present embodiment, the first groove 110 passes through the device wafer 100, as described above. The configuration in which the first groove 110 passes through the device wafer 100 allows the resin layer 9 to cover a wider area of each of the packages 10, for example, as compared with the first embodiment described above, whereby the function of the resin layer 9 becomes more remarkable.

The thus configured second embodiment can provide the same effects as those provided by the first embodiment described above.

Third Embodiment

Figure 20:
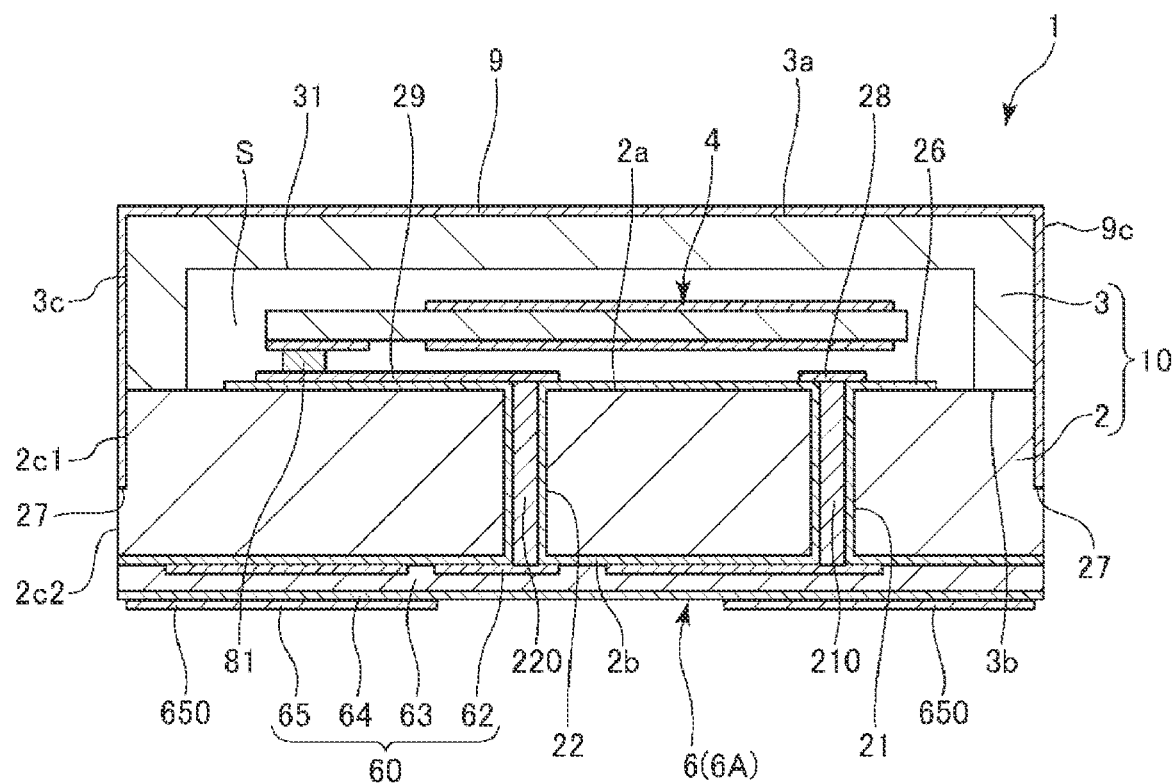
FIG. 20 is a cross-sectional view showing the vibration device according to a third embodiment.

FIG. 20 is a cross-sectional view showing the vibration device according to a third embodiment.

The present embodiment is the same as the first embodiment described above primarily except in that the base 2 and the lid 3 are bonded to each other in a different manner. In the following description, the present embodiment will be described primarily on the difference from the embodiments described above, and the same items as those in the embodiments described above will not be described. In FIG. 20, the same configurations as those in the embodiments described above have the same reference characters.

In the vibration device 1 according to the present embodiment, the upper surface 2a of the base 2 and the lower surface 3b of the lid 3 are bonded to each other in surface activation bonding, as shown in FIG. 20. Surface activation bonding is a bonding method in which, for example, the upper surface 2a of the base 2 and the lower surface 3b of the lid 3 are activated by radiation of an ion beam or plasma and the activated surfaces of the silicon substrates are directly bonded to each other with no other member interposed therebetween. The bonding method described above allows the lid 3 and the base 2 to be bonded to each other more firmly and intimately, whereby the strength of the package 10 can be increased, and the breakdown of the airtightness of the housing S can be effectively suppressed. Furthermore, since no other member is involved, the height of the package 10 can be reduced, that is, the size of the vibration device 1 can be reduced as compared, for example, with the first embodiment described above.

The method for manufacturing the vibration device 1 is the same as the manufacturing method according to the first embodiment described above except in that the surface activation bonding is performed in the bonding step S13. Since the surface activation bonding has already been described, the description of the method for manufacturing the vibration device 1 is omitted in the present embodiment.

As described above, in the method for manufacturing the vibration device 1 according to the present embodiment, in the bonding step S13 of bonding the lid wafer 30, the base wafer 20 and the lid wafer 30 are bonded to each other by using the surface activation bonding. The bonding method described above allows the base wafer 20 and the lid wafer 30 to be bonded to each other more firmly and intimately, whereby the strength of the vibration device 1 can be increased, and the breakdown of the airtightness of the housing S can be effectively suppressed. Furthermore, since no other member is involved, the height of the vibration device 1 can be reduced, that is, the size of the vibration device 1 can be reduced as compared, for example, with the first embodiment described above.

The thus configured third embodiment can provide the same effects as those provided by the first embodiment described above.

Fourth Embodiment

Figure 21:
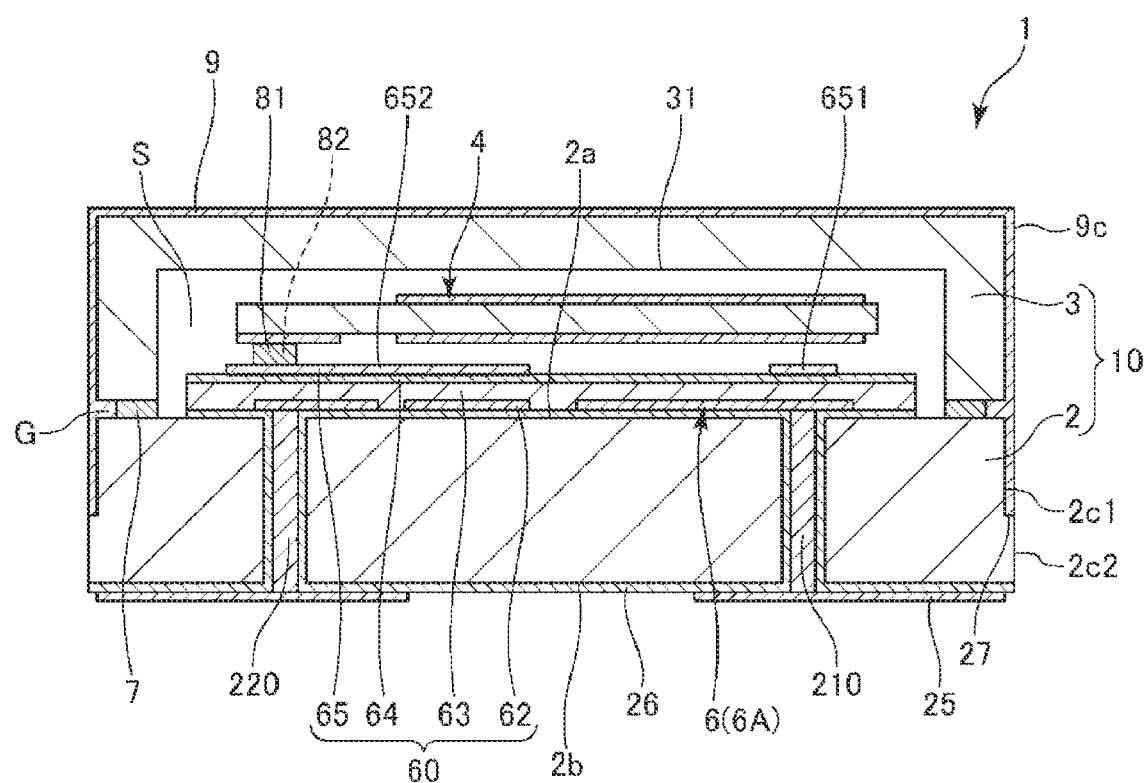
FIG. 21 is a cross-sectional view showing the vibration device according to a fourth embodiment.

FIG. 21 is a cross-sectional view showing the vibration device according to a fourth embodiment.

The present embodiment is the same as the first embodiment described above primarily except in that the integrated circuit 6 is arranged differently. In the following description, the present embodiment will be described primarily on the difference from the embodiments described above, and the same items as those in the embodiments described above will not be described. In FIG. 21, the same configurations as those in the embodiments described above have the same reference characters.

In the vibration device 1 according to the present embodiment, the integrated circuit 6 including the oscillation circuit 6A is disposed on the side facing the upper surface 2a of the base 2 and housed in the housing S, as shown in FIG. 21. The configuration described above can protect the integrated circuit 6 from moisture and dust. The reliability of the vibration device 1 can therefore be improved. In the present embodiment, the vibration element 4 is mounted on the integrated circuit 6, and the terminal layer 65 includes wiring lines 651 and 652 electrically coupled to the vibration element 4 via the metal bumps 81 and 82. External terminals 25 electrically coupled to the integrated circuit 6 via the through electrodes 210 and 220 are disposed on the side facing the lower surface 2b of the base 2.

As described above, in the vibration device 1 according to the present embodiment, the oscillation circuit 6A is located on the side facing the upper surface 2a of the base 2. The configuration described above can protect the oscillation circuit 6A from moisture and dust. The reliability of the vibration device 1 can therefore be improved.

The thus configured fourth embodiment can also provide the same effects as those provided by the first embodiment described above.

The method for manufacturing the vibration device according to the present disclosure have been described above based on the illustrated embodiments, but the present disclosure is not limited thereto, and the configuration of each portion can be replaced with any configuration having the same function. Furthermore, any other constituent element may be added to any of the embodiments of the present disclosure. Moreover, the embodiments may be combined as appropriate with each other.

In the embodiments described above, the resin layer 9 is disposed at the upper and side surfaces of the package 10, but the resin layer 9 is not necessarily disposed in a specific arrangement. For example, the resin layer may not be provided at the upper surface of the package 10.

What is claimed is:

1. A method for manufacturing a plurality of vibration devices, the method comprising:

preparing a base wafer having a first surface and a second surface outwardly opposite to each other and including a first plurality of fragmentation regions therein, a first boundary being located between adjacent fragmentation regions of the first plurality of fragmentation regions;

placing a vibration element at the first surface of the base wafer for each of the first plurality of fragmentation regions;

bonding a lid wafer to the first surface of the base wafer via a plurality of metal layers, the lid wafer having a second plurality of fragmentation regions corresponding to the first plurality of fragmentation regions, respectively, each of the second plurality of fragmentation regions having a recess housing the vibration element therein, a second boundary being located between adjacent fragmentation regions of the second plurality of fragmentation regions, the first boundary aligning with the second boundary, each of the plurality of metal layers surrounding the vibration element in a plan view, a gap being provided between adjacent metal layers of the plurality of metal layers and between ends of the first and second boundaries;

forming a first groove in the first and second boundaries, the first groove completely extending through the second boundary of the lid wafer and extending through at least a portion of the first boundary of the base wafer;

placing a resin material in the first groove so that the resin material being filled in the gap and the first groove; and forming a second groove along the first and second boundaries to produce the plurality of vibration devices, the second groove having a width smaller than a width of the first groove.

2. The method for manufacturing a plurality of vibration devices according to claim 1, wherein the first groove is a bottomed groove.

3. The method for manufacturing a plurality of vibration devices according to claim 1, wherein the first groove extends through the first boundary of the base wafer.

4. The method for manufacturing a plurality of vibration devices according to claim 1, wherein in the placing of the resin material, the resin material is also placed at a top surface of the lid wafer that is a surface opposite from the base wafer.

5. The method for manufacturing a plurality of vibration devices according to claim 1, wherein an outer edge of each of the plurality of metal layers is located inside an outer edge of each of the first plurality of fragmentation regions in the plan view.

6. The method for manufacturing a plurality of vibration devices according to claim 5, wherein the gap is provided by being enclosed by the base wafer, the lid wafer, and the adjacent metal layers of the plurality of metal layers after the lid wafer is bonded to the base wafer and before the first groove is formed.

7. The method for manufacturing a plurality of vibration devices according to claim 1, wherein in the bonding of the lid wafer, the base wafer and the lid wafer are bonded to each other by using surface activation bonding.

8. The method for manufacturing a plurality of vibration devices according to claim 1, wherein the first groove is formed while a holding member holds the second surface of the base wafer.

9. The method for manufacturing a plurality of vibration devices according to claim 1, wherein the base wafer is a semiconductor substrate, and an oscillation circuit is disposed in each of the first plurality of fragmentation regions of the base wafer.

10. The method for manufacturing a plurality of vibration devices according to claim 9,
wherein the lid wafer is a semiconductor substrate and is bonded to the base wafer so as to be electrically coupled to the base wafer.

* * * * *